(12) United States Patent
Miyamura et al.

(10) Patent No.: US 11,482,804 B2
(45) Date of Patent: Oct. 25, 2022

(54) CONNECTOR AND BOARD UNIT (71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Tetsuya Miyamura, Mie (JP); Masanori Moriyasu, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/277,834

(22) PCT Filed: Sep. 12, 2019

(86) PCT No.: PCT/JP2019/035802
§ 371 (c)(1),
(2) Date: Mar. 19, 2021

(87) PCT Pub. No.: WO2020/071078
PCT Pub. Date: Apr. 9, 2020

(65) Prior Publication Data
US 2021/0351530 A1 Nov. 11, 2021

(30) Foreign Application Priority Data
Oct. 3, 2018 (JP) .............................. JP2018-188023

(51) Int. Cl.
*H01R 12/72* (2011.01)

(52) U.S. Cl.
CPC ................................. *H01R 12/721* (2013.01)

(58) Field of Classification Search
CPC ..................................................... H01R 12/721
(Continued)

(56) References Cited

U.S. PATENT DOCUMENTS 7,351,096 B2 * 4/2008 Kondou ................. H01R 24/44
439/607.41
2007/0111597 A1 5/2007 Kondou et al.

FOREIGN PATENT DOCUMENTS

| JP | H11-121120 A | 4/1999 |
|---|---|---|
| JP | 2000-286027 A | 10/2000 |

(Continued)

OTHER PUBLICATIONS

International Search Report dated Oct. 8, 2019 for WO 2020/071078 A1 (2pages).

*Primary Examiner* — Peter G Leigh
(74) *Attorney, Agent, or Firm* — Venjuris, P.C.

(57) ABSTRACT

It is aimed to reduce an external force acting on a circuit board. A connector (10) is provided with a housing (12) including a board accommodating portion (13), a circuit board (42) accommodated in the board accommodating portion (13), a first terminal holding portion (26) formed in the housing (12) to be integrated with the board accommodating portion (13), a second terminal holding portion (30) formed in the housing (12) to be integrated with the board accommodating portion (13) and second terminal fittings (52) connected to the circuit board (42) while being held in the second terminal holding portion (30).

7 Claims, 8 Drawing Sheets

(58) Field of Classification Search
USPC .......................................................... 439/76.1
See application file for complete search history.

(56) References Cited

FOREIGN PATENT DOCUMENTS

JP       2011-243430 A    12/2011
JP          5471814 B2 *   4/2014

* cited by examiner

CONNECTOR AND BOARD UNIT

CROSS REFERENCE TO RELATED APPLICATIONS

This application is a national phase of PCT application No. PCT/JP2019/035802, filed on 12 Sep. 2019, which claims priority from Japanese patent application No. 2018-188023, filed on 3 Oct. 2018, all of which are incorporated herein by reference.

TECHNICAL FIELD

The present disclosure relates to a connector and a board unit.

BACKGROUND

Patent Document 1 discloses an electronic circuit unit in which a circuit board is accommodated in a case. The case is configured by uniting a first case member and a second case member. The first and second case members are formed with terminal holding portions located to sandwich the circuit board. Terminals inserted into the terminal holding portion of the first case member are connected to one edge part of the circuit board, and terminals inserted into the terminal holding portion of the second case member are connected to another edge of the circuit board. Wires connected to the respective terminals are drawn out to the outside of the case.

PRIOR ART DOCUMENT

Patent Document

Patent Document 1: JP 2011-243430 A

SUMMARY OF THE INVENTION

Problems to be Solved

In the above electronic circuit unit, the case is composed of two members, i.e. the first and second case members. Thus, if a bending force acts on the wires, the first and second case members are relatively displaced to tilt and the bending force may act on the circuit board due to these relative displacements.

The present disclosure was completed on the basis of the above situation and aims to reduce an external force acting on a circuit board.

Means to Solve the Problem

A first aspect of the present disclosure is directed to a connector with a housing including a board accommodating portion, a circuit board accommodated in the board accommodating portion, a pair of terminal holding portions formed in the housing to be integrated with the board accommodating portion, and terminal fittings connected to the circuit board while being held in the terminal holding portions.

A second aspect of the present disclosure is directed to a board unit with a housing including a board accommodating portion, a circuit board accommodated in the board accommodating portion, and a pair of terminal holding portions formed in the housing to be integrated with the board accommodating portion and capable of holding the terminal fittings.

Effect of the Invention

According to the first and second aspects of the present disclosure, it is possible to reduce an external force acting on the circuit board.

DETAILED DESCRIPTION TO EXECUTE THE INVENTION

Description of Embodiments of Present Disclosure

First, embodiments of the present disclosure are listed and described.

(1) The connector of the first aspect of the present disclosure is provided with a housing including a board accommodating portion, a circuit board accommodated in the board accommodating portion, a pair of terminal holding portions formed in the housing to be integrated with the board accommodating portion, and terminal fittings connected to the circuit board while being held in the terminal holding portions.

According to the configuration of the first aspect of the present disclosure, since the pair of terminal holding portions are integrated with the board accommodating portion, even if an external force acts to relatively tilt the pair of terminal holding portions, the deformation of the board accommodating portion is suppressed by the rigidity of the housing. Thus, an external force acting on the circuit board is reduced.

(2) Preferably, the pair of terminal holding portions are disposed on sides opposite to each other across the board accommodating portion. According to this configuration, since the housing has an elongated shape as a whole, the housing can be arranged along a wiring harness.

(3) Preferably, the connector is provided with a board insertion opening in the form of a slit open in an outer surface of the board accommodating portion, the circuit board being insertable into the board insertion opening in a direction intersecting a plate thickness direction of the circuit board. According to this configuration, since an opening area in the outer surface of the board accommodating portion can be reduced, a reduction in the rigidity of the board accommodating portion can be avoided.

(4) Preferably, terminal accommodation chambers into which the terminal fittings are inserted toward the circuit board are formed in the terminal holding portions, the terminal fitting is formed with a resilient contact piece configured to contact a terminal contact surface of the circuit board with the terminal fitting inserted in the terminal accommodation chamber, and guiding surfaces disposed closer to the terminal accommodation chambers than the terminal contact surface are formed on end parts of the terminal accommodation chambers on the side of the circuit board. According to this configuration, in the process of inserting the terminal fitting into the terminal accommodation chamber, the resilient contact piece contacts the terminal contact surface without butting against an end surface of the circuit board by sliding in contact with the guiding surface.

(5) The board unit of the second aspect of the present disclosure is provided with a housing including a board accommodating portion, a circuit board accommodated in the board accommodating portion, and a pair of terminal holding portions formed in the housing to be integrated with the board accommodating portion and capable of holding the terminal fittings.

According to the configuration of the second aspect of the present disclosure, since the pair of terminal holding portions are integrated with the board accommodating portion, even if an external force acts to relatively tilt the pair of terminal holding portions, the deformation of the board accommodating portion is suppressed by the rigidity of the housing. Thus, an external force acting on the circuit board is reduced.

Details of Embodiments of Present Disclosure

Embodiment

Figure 1:
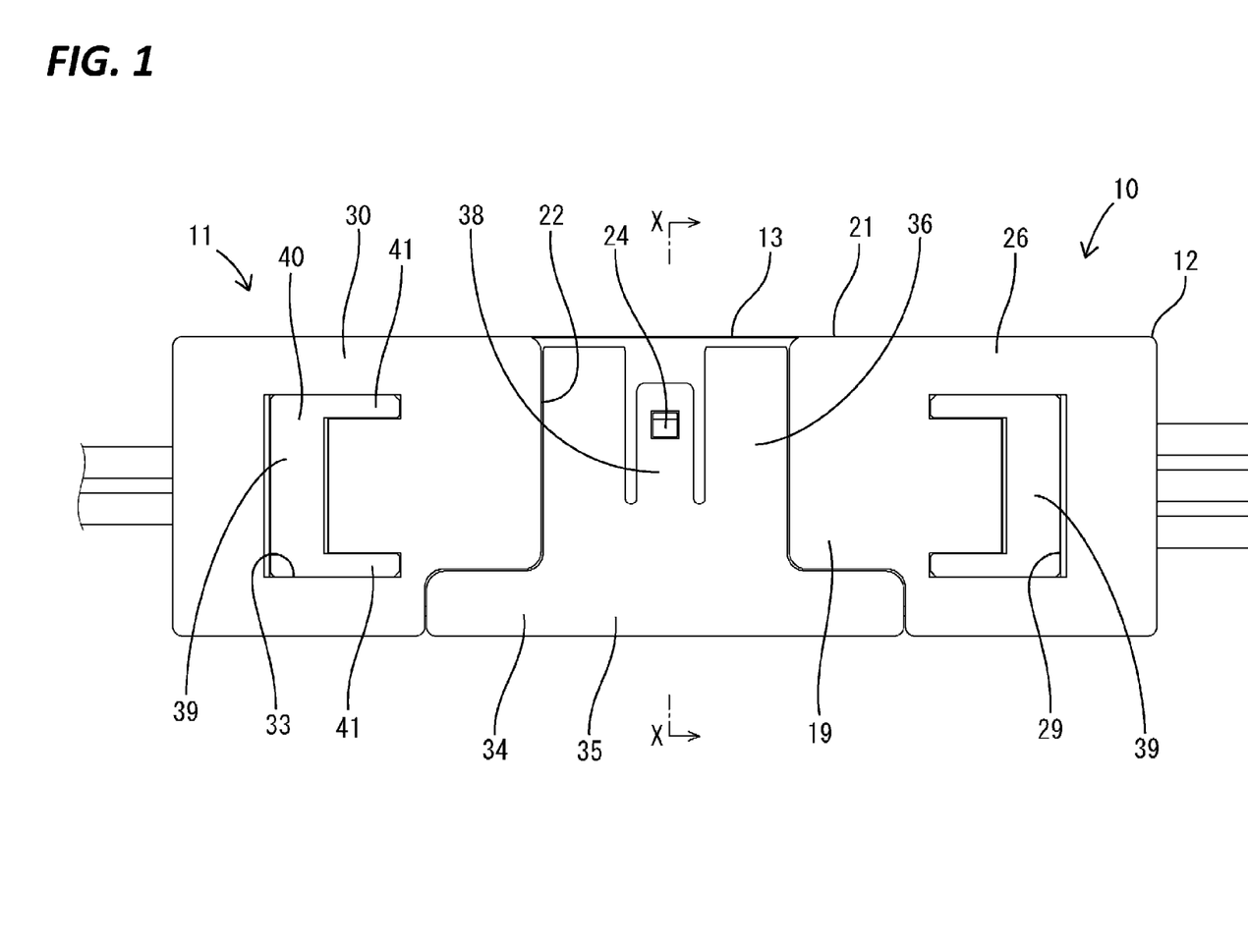
FIG. 1 is a plan view of a connector of one embodiment.
Figure 2:
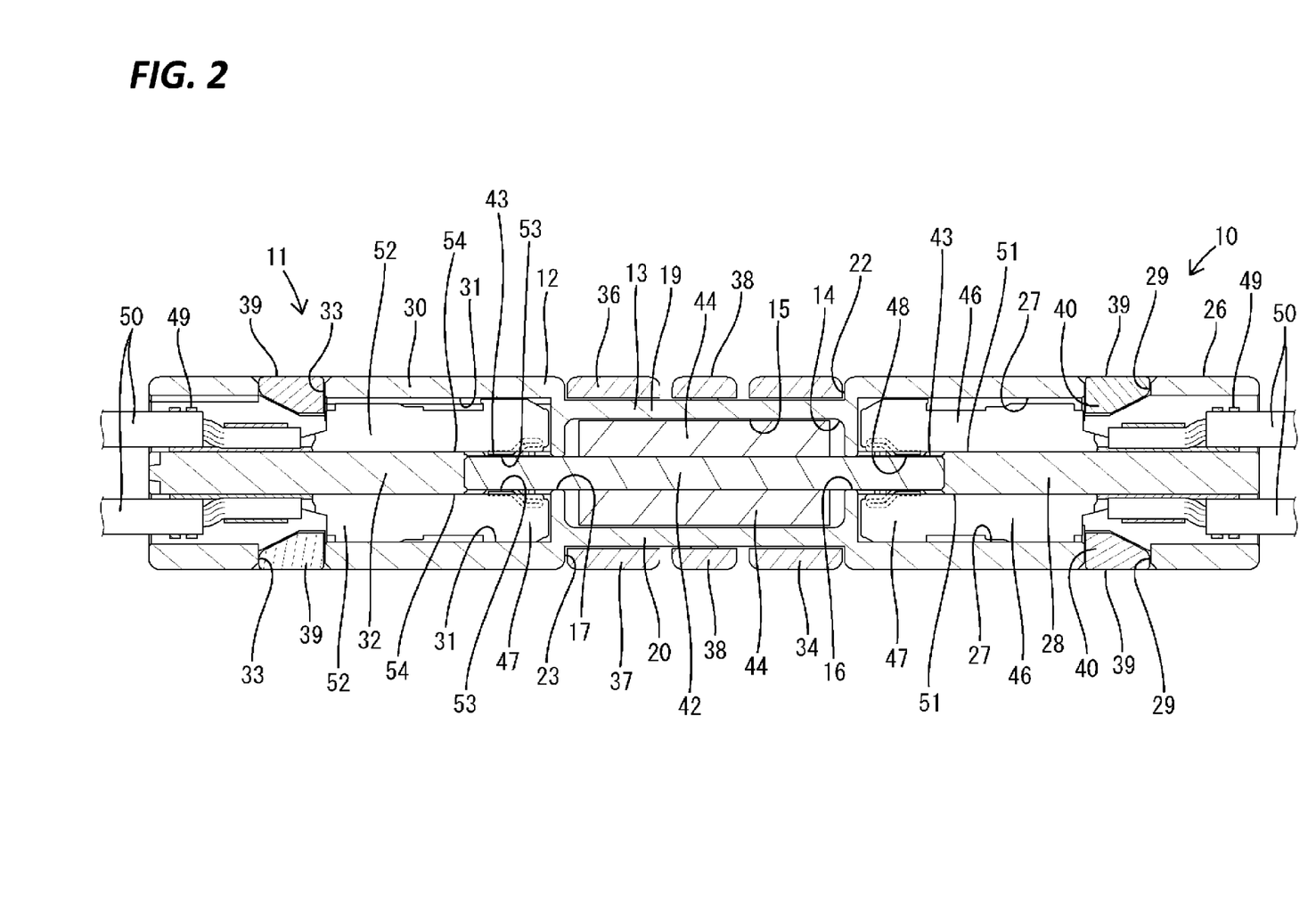
FIG. 2 is a side view in section of the connector.
Figure 3:
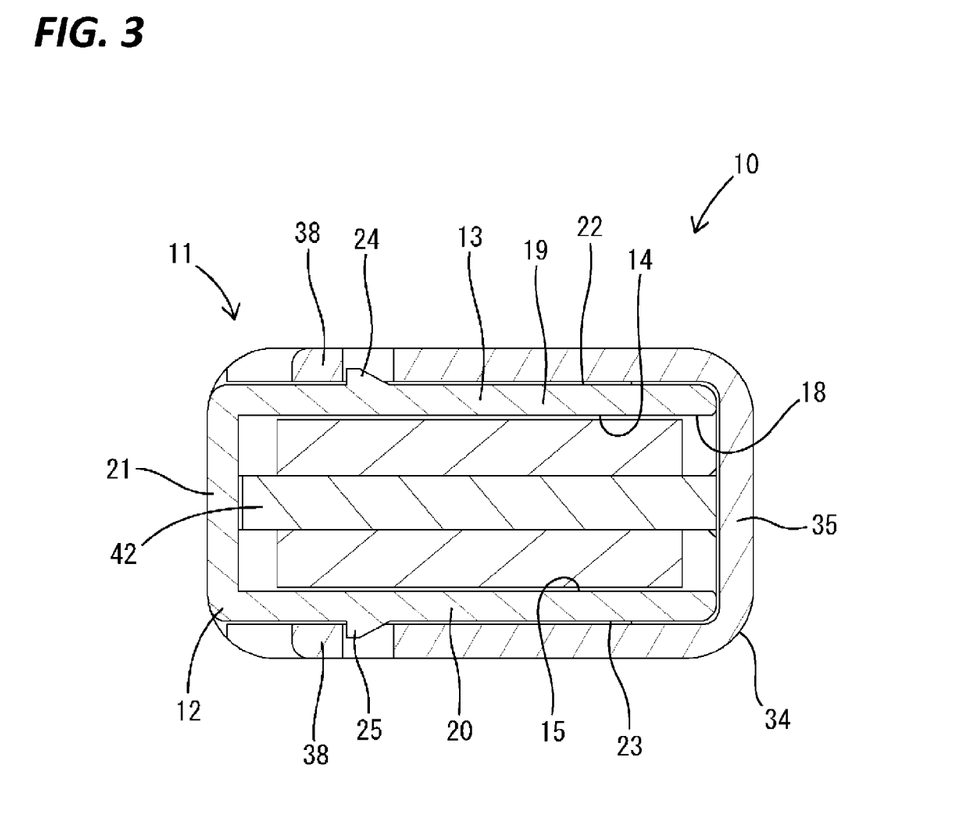
FIG. 3 is a section along X-X of FIG. 1.
Figure 4:
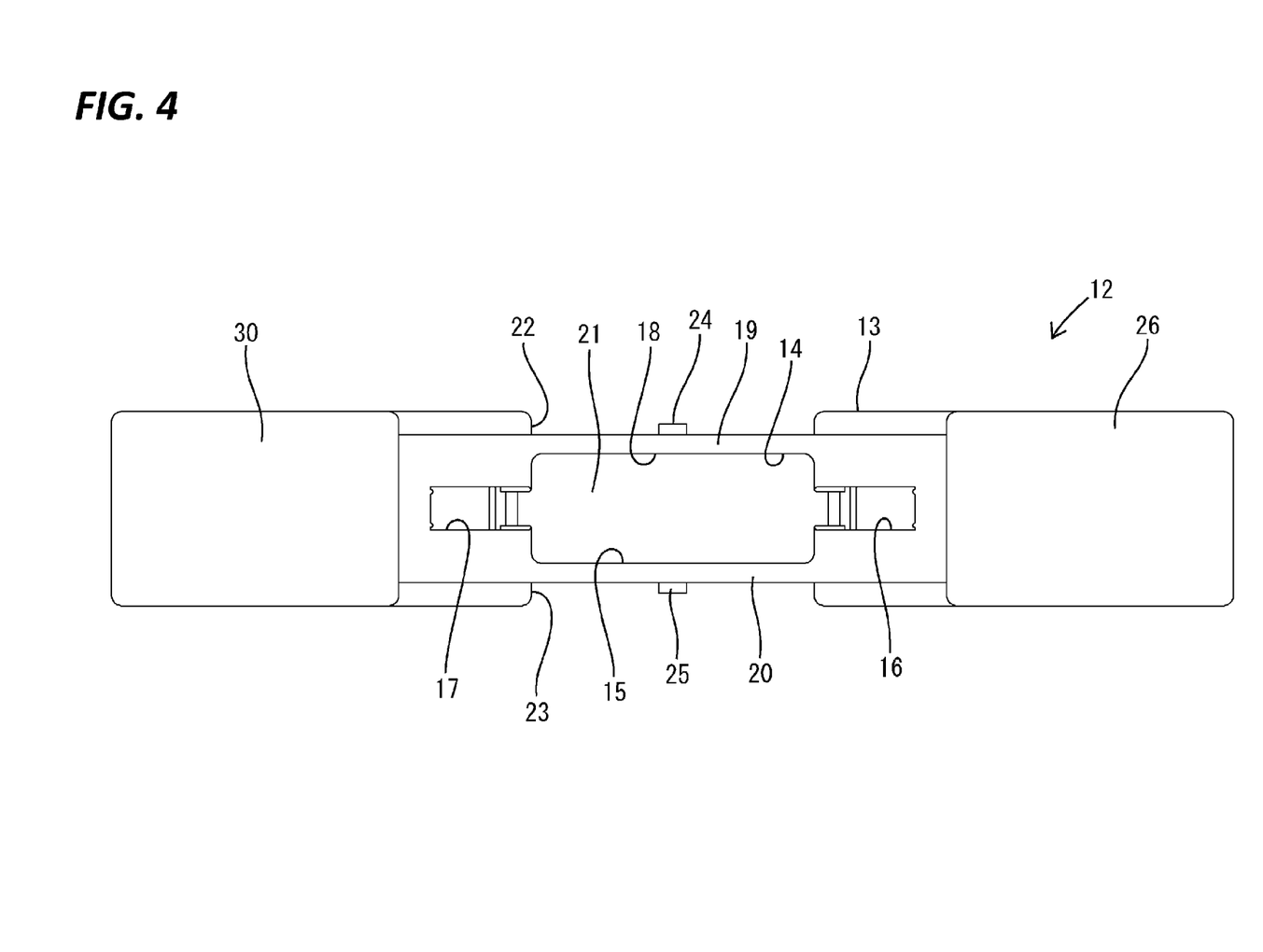
FIG. 4 is a right side view of a housing.
Figure 5:
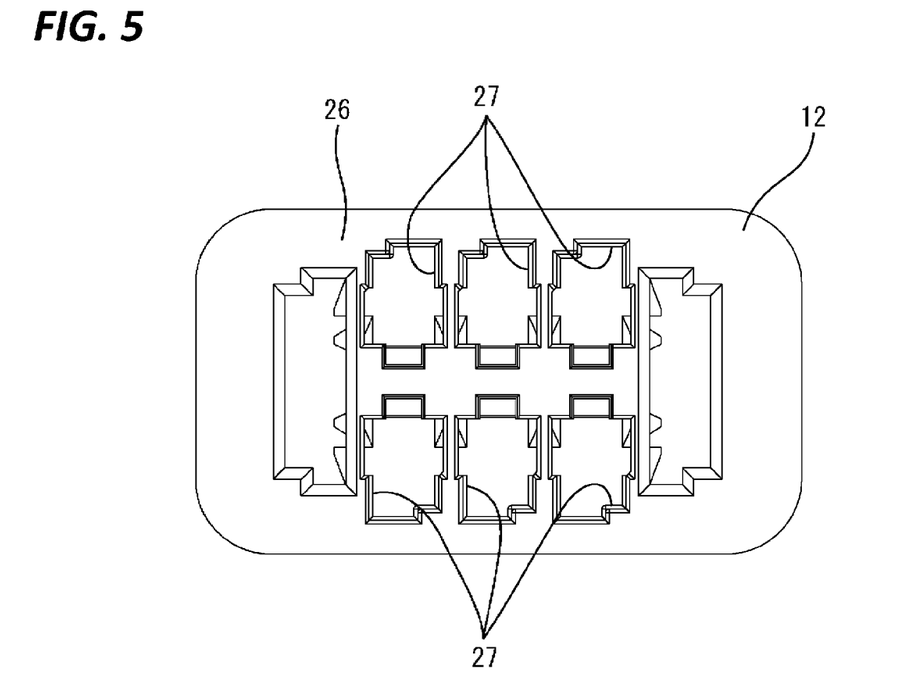
FIG. 5 is a front view of the housing.
Figure 6:
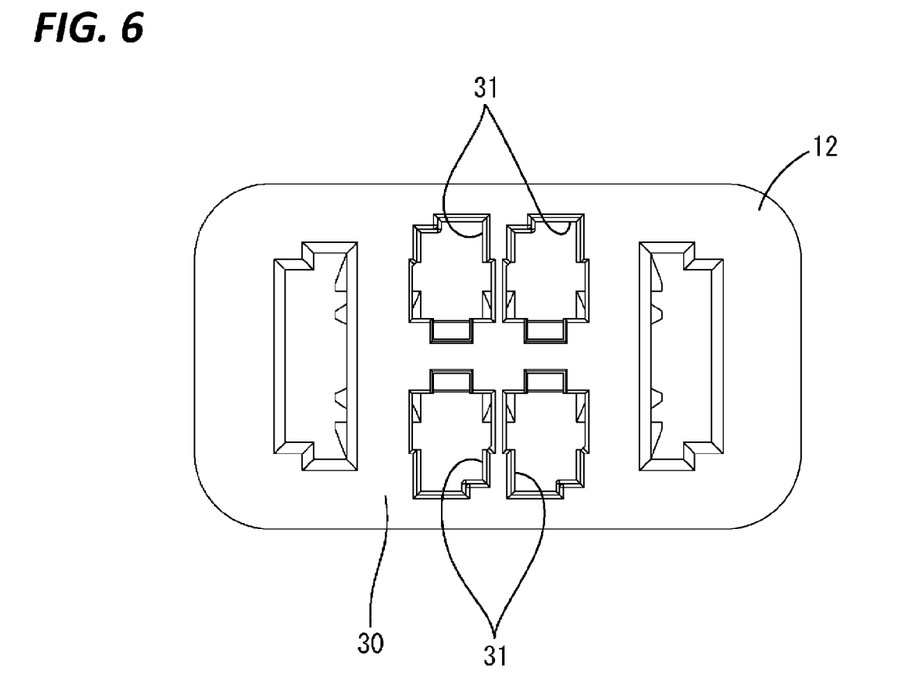
FIG. 6 is a back view of the housing.
Figure 7:
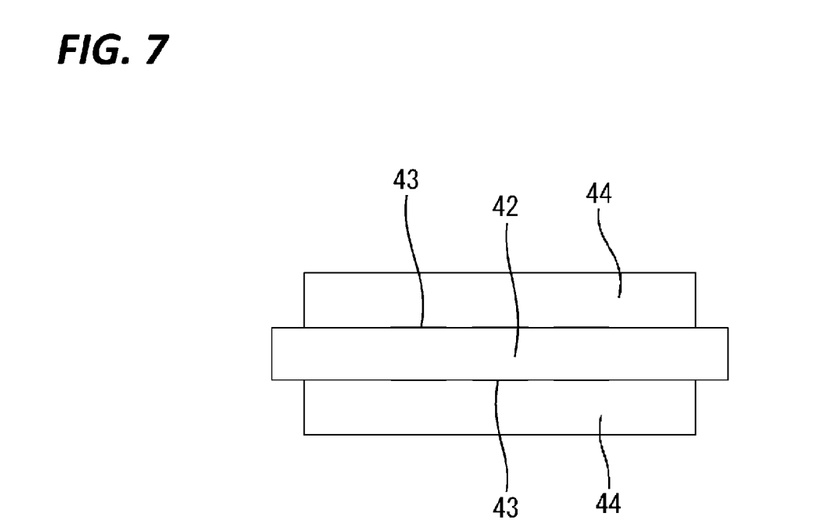
FIG. 7 is a front view of a circuit board.
Figure 8:
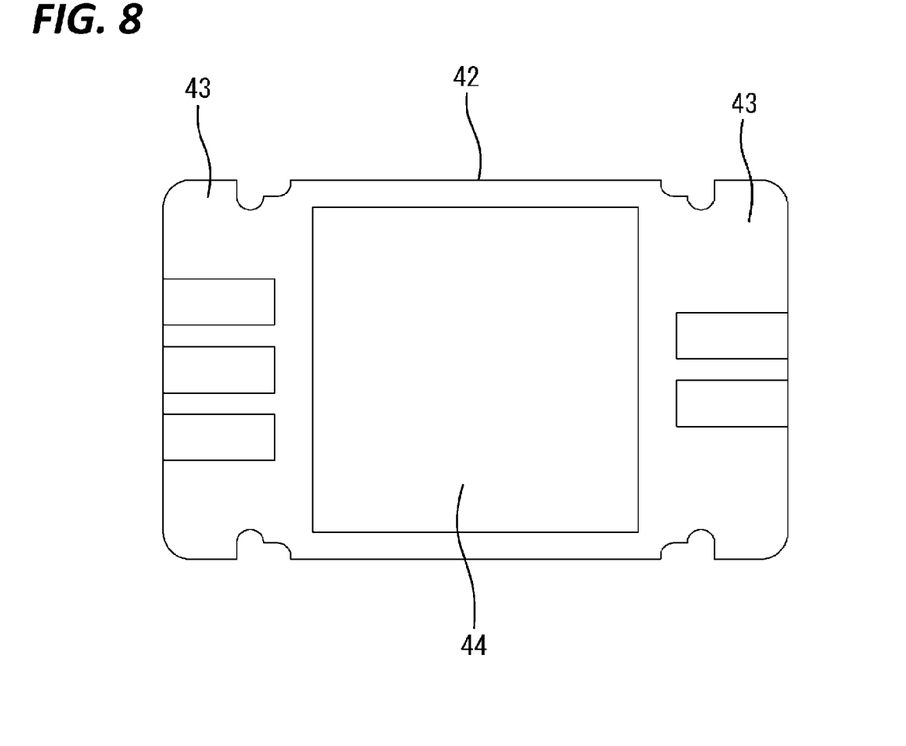
FIG. 8 is a plan view of the circuit board.
Figure 9:
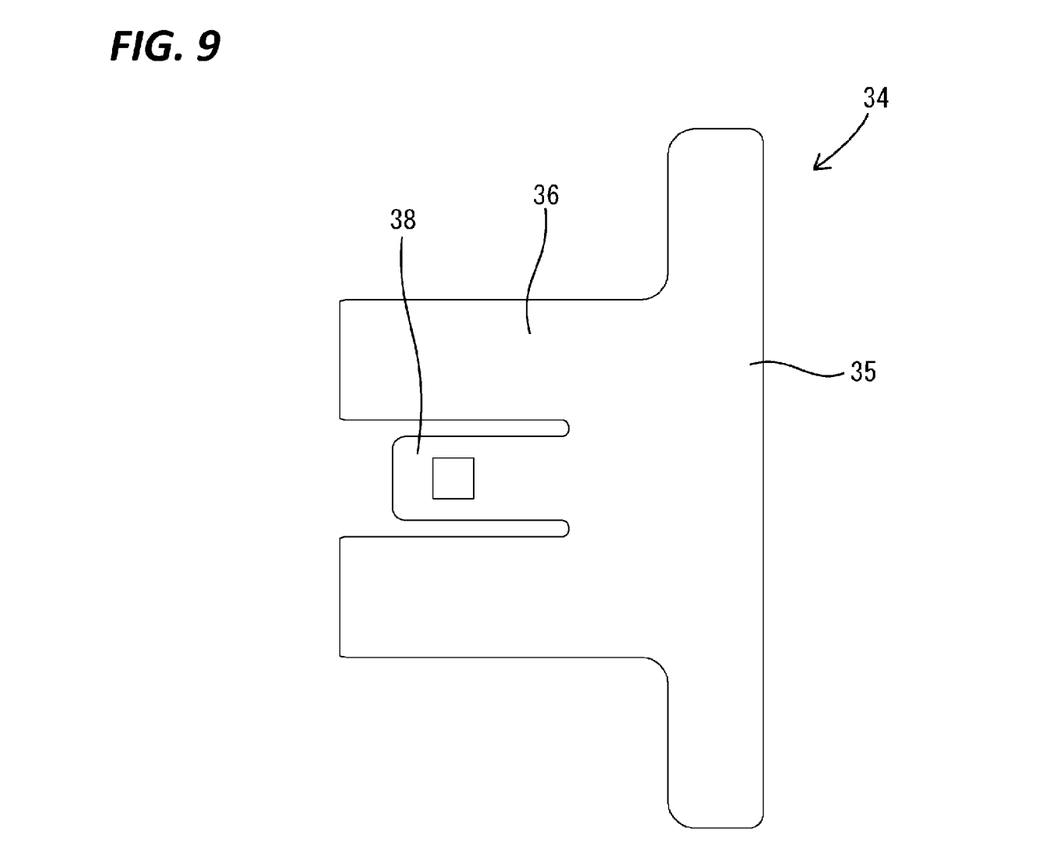
FIG. 9 is a plan view of a cover.
Figure 10:
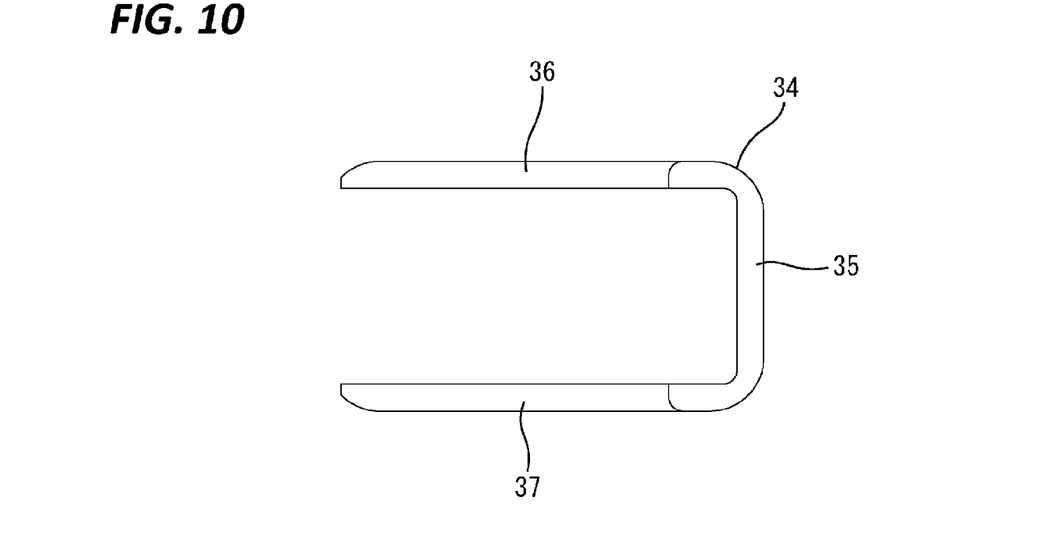
FIG. 10 is a back view of the cover.

Hereinafter, one specific embodiment of the present disclosure is described with reference to FIGS. 1 to 12. Note that the present invention is not limited to these illustrations and is intended to be represented by claims and include all changes in the scope of claims and in the meaning and scope of equivalents. In the following description, a right side in FIGS. 1, 2, 4, 8 and 9 is defined as a front side concerning a front-rear direction. Upper and lower sides shown in FIGS. 2 to 7 and 10 to 12 are directly defined as upper and lower sides concerning a vertical direction. A lower side in FIGS. 1, 8 and 9 is defined as a right side concerning a lateral direction.

A female connector 10 of this embodiment is configured by mounting a plurality of first terminal fittings 46 (terminal fittings as claimed) and a plurality of second terminal fittings 52 (terminal fittings as claimed) into a board unit 11. The board unit 11 is configured by assembling a housing 12 made of synthetic resin, a cover 34 made of synthetic resin, two pairs of retainers 39 made of synthetic resin and a circuit board 42.

The housing 12 has an elongated shape in the front-rear direction as a whole. The housing 12 is substantially rectangular in any of a front view, a plan view and a side view. A board accommodating portion 13 is formed in a central part in a longitudinal direction (front-rear direction) of the housing 12. A first terminal holding portion 26 (terminal holding portion as claimed) continuous with the front end of the board accommodating portion 13 is formed in a front end part of the housing 12. A second terminal holding portion 30 (terminal holding portion as claimed) continuous with the rear end of the board accommodating portion 13 is formed in a rear end part of the housing 12. The housing 12 is a single component integrally formed with the first terminal holding portion 26, the board accommodating portion 13 and the second terminal holding portion 30 connected one after another in the front-rear direction.

A board accommodation chamber 14 for accommodating the entire circuit board 42 is formed in the board accommodating portion 13. A central part in the front-rear direction of the board accommodation chamber 14 serves as a central accommodation chamber 15 having a large vertical dimension. A front end part of the board accommodation chamber 14 serves as a first accommodation chamber 16 having a smaller vertical dimension than the central accommodation chamber 15. A rear end part of the board accommodation chamber 14 serves as a second accommodation chamber 17 having a smaller vertical dimension than the central accommodation chamber 15. A part of the circuit board 42 where mold resins 44 protrude is accommodated in the central accommodation chamber 15. A front end part of the circuit board 42 is accommodated in the first accommodation chamber 16 while being vertically positioned. A rear end part of the circuit board 42 is accommodated in the second accommodation chamber 17 while being vertically positioned.

The board accommodation chamber 14 is open as a board insertion opening 18 only in a right side surface, out of outer surfaces of the board accommodating portion 13 (housing 12). The board insertion opening 18 is in the form of a slit elongated in the front-rear direction. In particular, the opening shape of the board insertion opening 18 is the same as side view shapes (side cross-sectional shapes) of the central accommodation chamber 15 and the first and second accommodation chambers 16, 17. An opening of the board accommodating portion 13 is only the slit-like board insertion opening 18, and an upper wall portion 19, a lower wall portion 20 and a left side wall portion 21 of the board accommodating portion 13 are integrated with the first and second terminal holding portions 26, 30. The board accommodating portion 13 of this embodiment has a high rigidity as compared to the case where a large opening is formed over the same range as terminal contact surfaces 43 of the circuit board 42 in the upper wall portion 19 or the lower wall portion 20.

The upper surface of the board accommodating portion 13 is lightly recessed with respect to the upper surfaces of the first and second terminal holding portions 26, 30, thereby forming an upper fitting recess 22. An upper lock projection 24 is formed in the upper fitting recess 22. The lower surface of the board accommodating portion 13 is lightly recessed with respect to the lower surfaces of the first and second terminal holding portions 26, 30, thereby forming a lower fitting recess 23. A lower lock projection 25 is formed in the lower fitting recess 23.

A plurality of (six in this embodiment) first terminal accommodation chambers 27 are formed laterally side by side in each of two upper and lower stages inside the first terminal holding portion 26. The first terminal accommodation chambers 27 in the upper stage and the first terminal accommodation chambers 27 in the lower stage are partitioned by a first partition wall portion 28. The first terminal accommodation chambers 27 are elongated in the front-rear direction. Back end parts (rear end parts) of the first terminal accommodation chambers 27 in the upper stage are disposed above the front end part of the board accommodation chamber 14 and communicate with the front end part of the board accommodation chamber 14. Back end parts of the first terminal accommodation chambers 27 in the lower stage are disposed below the front end part of the board accommodation chamber 14 and communicate with the front end part of the board accommodation chamber 14. Each of the upper surface (outer surface) and the lower surface (outer surface) of the first terminal holding portion 26 is formed with a first mounting hole 29 communicating with the first terminal accommodation chambers 27.

A plurality of (four in this embodiment) second terminal accommodation chambers 31 are formed laterally side by side in each of two upper and lower stages inside the second terminal holding portion 30. The second terminal accommodation chambers 31 in the upper stage and the second terminal accommodation chambers 31 in the lower stage are partitioned by a second partition wall portion 32. The second terminal accommodation chambers 31 are elongated in the front-rear direction. Back end parts (front end parts) of the second terminal accommodation chambers 31 in the upper stage are disposed above the rear end part of the board accommodation chamber 14 and communicate with the rear end part of the board accommodation chamber 14. Back end parts of the second terminal accommodation chambers 31 in the lower stage are disposed below the rear end part of the board accommodation chamber 14 and communicate with the rear end part of the board accommodation chamber 14. Each of the upper surface (outer surface) and the lower surface (outer surface) of the second terminal holding portion 30 is formed with a second mounting hole 33 communicating with the second terminal accommodation chambers 31.

As shown in FIG. 1, the cover 34 is assembled on the outer surface of the board accommodating portion 13 from right (in a direction orthogonal to the longitudinal direction of the housing 12) with respect to the board accommodating portion 13. As shown in FIGS. 1, 3, 9 and 10, the cover 34 is a single component including a right side plate portion 35 for covering the board insertion opening 18, an upper plate portion 36 to be fit into the upper fitting recess 22 and a lower plate portion 37 to be fit into the lower fitting recess 23. Each of the upper plate portion 36 and the lower plate portion 37 is formed with a resilient lock piece 38.

With the cover 34 assembled with the board accommodating portion 13, the upper resilient lock piece 38 is locked to the upper lock projection 24 and the lower resilient lock piece 38 is locked to the lower lock projection 25. By these locking actions, the cover 34 is held assembled with the board accommodating portion 13. Any of the outer surface of the right side plate portion 35, the outer surface of the upper plate portion 36 and the outer surface of the lower plate portion 37 is continuous and substantially flush with the outer surface of the housing 12.

Figure 11:
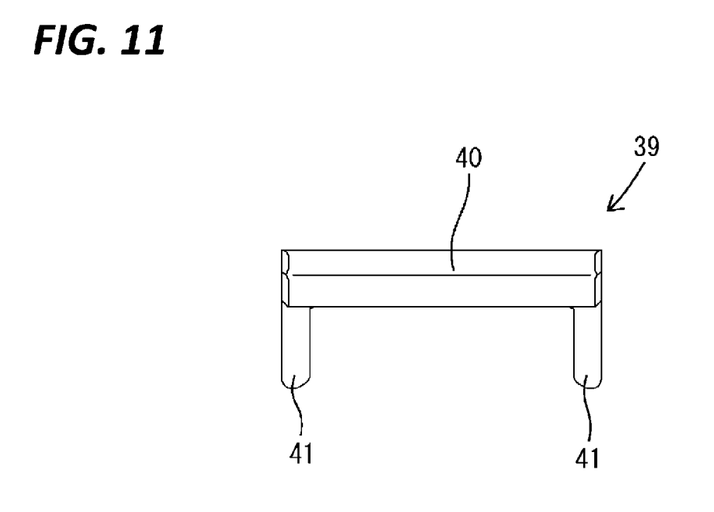
FIG. 11 is a front view of a retainer.
Figure 12:
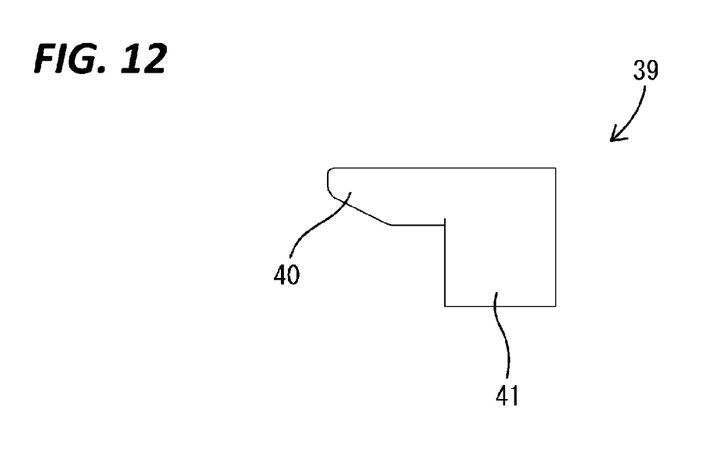
FIG. 12 is a side view of the retainer.

As shown in FIGS. 11 and 12, the retainer 39 is a single component including a retaining portion 40 extending in the lateral direction and a pair of supporting plate portions 41 extending substantially at a right angle from both left and right end parts of the retaining portion 40. The retainers 39 are assembled with the first terminal holding portion 26 by being inserted into the first mounting holes 29, and assembled with the second terminal holding portion 30 by being inserted into the second mounting holes 33. With the retainers 39 assembled with the first terminal holding portion 26, the retaining portions 40 are locked to rectangular tube portions 47 of the first terminal fittings 36 in the first terminal accommodation chambers 27 to hold the first terminal fittings 52 in a retained state. With the retainers 39 assembled with the second terminal holding portion 30, the retaining portions 40 are locked to rectangular tube portions 47 of the second terminal fittings 52 in the second terminal accommodation chambers 31 to hold the second terminal fittings 52 in a retained state.

The circuit board 42 is substantially rectangular in a plan view. The front surface (upper surface) and the back surface (lower surface) of the circuit board 42 serve as the terminal contact surfaces 43 printed with circuits (not shown). Various functional components (not shown) such as semiconductor elements are mounted on the terminal contact surfaces 43, and the mounted functional components are embedded in the mold resins 44. The functional components are mounted only in regions of the terminal contact surfaces 43 except front end edge parts and rear end edge parts. The front and rear end edge parts of the terminal contact surfaces 43 are exposed without being covered by the mold resins 44. First resilient contact pieces 48 of the first terminal fittings 46 and second resilient contact pieces 53 of the second terminal fittings 52 are resiliently in contact with these exposed regions of the terminal contact surfaces 43.

The circuit board 42 is inserted into the board insertion opening 18 while being parallelly moved from a right side of the housing 12 with a plate thickness direction oriented in the vertical direction (direction orthogonal to the longitudinal direction of the housing 12). The circuit board 42 inserted into the board insertion opening 18 is accommodated in the board accommodation chamber 14. An inserting direction of the circuit board 42 is a direction parallel to the terminal contact surfaces 43 (direction orthogonal to the plate thickness direction of the circuit board 42, direction orthogonal to the longitudinal direction of the housing 12).

Since the circuit board 42 accommodated into the board accommodation chamber 14 is vertically sandwiched between the upper wall portion 19 and the lower wall portion 20 of the board accommodating portion 13 and fit into the first and second accommodation chambers 16, 17, the circuit board 42 is positioned in the vertical direction. Further, since the front end edge of the circuit board 42 is in contact with or closely facing the rear end surface of the first partition wall portion 28 and the rear end edge of the circuit board 42 is in contact with or closely facing the front end surface of the second partition wall portion 32, the circuit board 42 in the board accommodating portion 13 is positioned in the front-rear direction.

After the circuit board 42 is accommodated into the board accommodating portion 13, the cover 34 is assembled with the board accommodating portion 13. With the cover 34 assembled with the board accommodating portion 13, the circuit board 42 is sandwiched between the left side wall portion of the board accommodating portion 13 and the right side plate portion 35 of the cover 34, thereby being positioned in the lateral direction with respect to the board accommodating portion 13.

The first terminal fitting 46 is formed such that the rectangular tube portion 47 and a crimping portion 49 are connected one after the other in the front-rear direction and has an elongated shape as a whole. The rectangular tube portion 47 is formed with the first resilient contact piece 48 projecting from an outer surface of the rectangular tube portion 47. A wire 50 is fixed to the crimping portion 49. The first terminal fitting 46 is inserted into the first terminal accommodation chamber 27 (first terminal holding portion 26) from the front of the housing 12.

With the first terminal fittings 46 inserted in the first terminal accommodation chamber 27, tip parts of the rectangular tube portions 47 in the upper stage and tip parts of the rectangular tube portions 47 in the lower stage are located to vertically sandwich a front end edge part of the circuit board 42. The first resilient contact pieces 48 in the upper stage and the first resilient contact pieces 48 in the lower stage are resiliently in contact with the both upper and lower terminal contact surfaces 43. After all the first terminal fittings 46 are inserted, the retainers 39 are mounted into the first mounting holes 29. When the retainers 39 are mounted, the retaining portions 40 of the retainers 39 are locked to the rectangular tube portions 47, whereby the first terminal fittings 46 are held in the retained state.

In the process of inserting the first terminal fitting 46 into the first terminal accommodation chamber 27, there is a concern that the first resilient contact piece 48 butts against the front end edge of the circuit board 42. However, in this embodiment, back end parts of the first terminal accommodation chambers 27 in the upper stage serve as first guiding surfaces 51 (guiding surfaces as claimed) raised in a stepped manner with respect to the upper terminal contact surface 43 of the circuit board 42. The first guiding surfaces 51 in the upper stage are disposed at positions closer to the first terminal accommodation chambers 27 in the upper stage than the terminal contact surface 43. Thus, in the inserting process of the first terminal fitting 46, the first resilient contact piece 48 moves to the terminal contact surface 43 without butting against the front end edge of the circuit board 42 after resiliently sliding in contact with the first guiding surface 51.

Further, back end parts of the first terminal accommodation chambers 27 in the lower stage serve as first guiding surfaces 51 lowered in a stepped manner with respect to the lower terminal contact surface 43 of the circuit board 42. The first guiding surfaces 51 in the lower stage are disposed at positions closer to the first terminal accommodation chambers 27 in the lower stage than the terminal contact surface 43. Thus, in the inserting process of the first terminal fitting 46, the first resilient contact piece 48 moves to the terminal contact surface 43 without butting against the front end edge of the circuit board 42 after resiliently sliding in contact with the first guiding surface 51.

Similarly to the first terminal fitting 46, the second terminal fitting 52 is also formed such that the rectangular tube portion 47 and a crimping portion 49 are connected one after the other in the front-rear direction and has an elongated shape as a whole. The rectangular tube portion 47 is formed with the second resilient contact piece 53 projecting from an outer surface of the rectangular tube portion 47. A wire 50 is fixed to the crimping portion 49. The second terminal fitting 52 is inserted into the second terminal accommodation chamber 31 (second terminal holding portion 30) from behind the housing 12.

With the second terminal fittings 52 inserted in the second terminal accommodation chamber 31, tip parts of the rectangular tube portions 47 in the upper stage and tip parts of the rectangular tube portions 47 in the lower stage are located to vertically sandwich a rear end edge part of the circuit board 42. The second resilient contact pieces 53 in the upper stage and the second resilient contact pieces 53 in the lower stage are resiliently in contact with the both upper and lower terminal contact surfaces 43. After all the second terminal fittings 52 are inserted, the retainers 39 are mounted into the second mounting holes 33. When the retainers 39 are mounted, the retaining portions 40 of the retainers 39 are locked to the rectangular tube portions 47, whereby the second terminal fittings 52 are held in the retained state.

In the process of inserting the second terminal fitting 52 into the second terminal accommodation chamber 31, there is a concern that the second resilient contact piece 53 butts against the rear end edge of the circuit board 42. However, in this embodiment, back end parts of the second terminal accommodation chambers 31 in the upper stage serve as second guiding surfaces 54 (guiding surfaces as claimed) raised in a stepped manner with respect to the upper terminal contact surface 43 of the circuit board 42. The second guiding surfaces 54 in the upper stage are disposed at positions closer to the second terminal accommodation chambers 31 in the upper stage than the terminal contact surface 43. Thus, in the inserting process of the second terminal fitting 52, the second resilient contact piece 53 moves to the terminal contact surface 43 without butting against the rear end edge of the circuit board 42 after resiliently sliding in contact with the second guiding surface 54.

Further, back end parts of the second terminal accommodation chambers 31 in the lower stage serve as second guiding surfaces 54 lowered in a stepped manner with respect to the lower terminal contact surface 43 of the circuit board 42. The second guiding surfaces 54 in the lower stage are disposed at positions closer to the second terminal accommodation chambers 31 in the lower stage than the terminal contact surface 43. Thus, in the inserting process of the first terminal fitting 52, the second resilient contact piece 53 moves to the terminal contact surface 43 without butting against the rear end edge of the circuit board 42 after resiliently sliding in contact with the second guiding surface 54.

The connector 10 of this embodiment includes the board unit 11, the plurality of first terminal fittings 46 and the plurality of second terminal fittings 52. The board unit 11 includes the housing 12 having the board accommodating portion 13, the circuit board 42 accommodated in the board accommodating portion 13 and the pair of terminal holding portions (first terminal holding portion 26 and second terminal holding portion 30) formed in the housing 12 to be integrated with the board accommodating portion 13. The first terminal fittings 46 are connected to the front end parts of the terminal contact surfaces 43 of the circuit board 42 while being held in the first terminal holding portion 26. The second terminal fittings 52 are connected to the rear end parts of the terminal contact surfaces 43 of the circuit board 42 while being held in the second terminal holding portion 30.

In the connector 10 (board unit 11) of this embodiment, the pair of terminal holding portions (first terminal holding portion 26 and second terminal holding portion 30) are integrated with the board accommodating portion 13. Accordingly, even if a bending force or the like acts on parts of the wires 50 drawn out to the outside of the housing 12 and an external force acts to relatively tilt the first and second terminal holding portions 26, 30, the deformation of the board accommodating portion 13 is suppressed by the rigidity of the housing 12. Since the deformation of the board accommodating portion 13 is suppressed, an external force acting on the circuit board 42 due to the deformation of the board accommodating portion 13 is reduced.

Further, since the pair of terminal holding portions (first terminal holding portion 26 and second terminal holding portion 30) are disposed on sides opposite to each other across the board accommodating portion 13, the housing 12 has an elongated shape in the front-rear direction as a whole. Accordingly, when the connector 10 (housing 12) is arranged along a wiring harness (not shown) and fixed to the wiring harness by taping or the like, bulging in a radial direction is suppressed to be small.

Further, the board accommodating portion 13 is formed with the board insertion opening 18 in the form of a slit open in the outer surface of the board accommodating portion 13. The circuit board 42 is inserted into the board insertion opening 18 in the direction intersecting the plate thickness direction of the circuit board 42. According to this configuration, since an opening area in the outer surface of the board accommodating portion 13 can be reduced, a reduction in the rigidity of the board accommodating portion 13 can be avoided.

Further, the first terminal accommodation chambers 27 into which the first terminal fittings 46 are inserted toward the circuit board 42 are formed in the first terminal holding portion 26, and the first terminal fittings 46 are formed with the first resilient contact pieces 48 to be held in contact with the terminal contact surfaces 43 of the circuit board 42 in a state inserted in the first accommodation chambers 27. The first guiding surfaces 51 located closer to the first terminal accommodation chambers 27 than the terminal contact surfaces 43 are formed on the end parts of the first terminal accommodation chambers 27 on the side of the circuit board 42. According to this configuration, in the process of inserting the first terminal fitting 46 into the first terminal accommodation chamber 27, the first resilient contact piece 48 contacts the terminal contact surface 43 without butting against the end surface of the circuit board 42 by sliding in contact with the first guiding surface 51.

Further, the second terminal accommodation chambers 31 into which the second terminal fittings 52 are inserted toward the circuit board 42 are formed in the second terminal holding portion 30, and the second terminal fittings 52 are formed with the second resilient contact pieces 53 to be held in contact with the terminal contact surfaces 43 of the circuit board 42 in a state inserted in the second accommodation chambers 31. The second guiding surfaces 54 located closer to the second terminal accommodation chambers 31 than the terminal contact surfaces 43 are formed on the end parts of the second terminal accommodation chambers 31 on the side of the circuit board 42. According to this configuration, in the process of inserting the second terminal fitting 52 into the second terminal accommodation chamber 31, the second resilient contact piece 53 contacts the terminal contact surface 43 without butting against the end surface of the circuit board 42 by sliding in contact with the second guiding surface 54.

Other Embodiments

The present invention is not limited to the above described and illustrated embodiment. For example, the following embodiments are also included in the technical scope of the present invention.

Although the pair of terminal holding portions (first terminal holding portion 26 and second terminal holding portion 30) and the board accommodating portion are disposed to be substantially linearly connected in the above embodiment, the pair of terminal holding portions and the board accommodating portion may be disposed to form a substantially L shape.

Although the board insertion opening has a slit-like opening shape in the above embodiment, the board insertion opening may have an opening shape corresponding to the terminal contact surfaces of the circuit board.

Although the guiding surfaces are formed in both the first and second terminal accommodation chambers in the above embodiment, the guiding surfaces may be formed only in either the first terminal accommodation chambers or second terminal accommodation chambers.

Although the guiding surfaces are formed in the terminal accommodation chambers in the above embodiment, no guiding surface may be formed in the terminal accommodation chambers.

Although the cover for closing the board insertion opening and the circuit board are separately handled in the above embodiment, an integral assembly of the cover and the circuit board may be mounted on and in the housing.

Although the retainers for retaining the terminal fittings are provided separately from the cover in the above embodiment, the cover and the retainers may be integrally molded.

List of Reference Numerals

| | |
|---|---|
| 10 | connector |
| 11 | board unit |
| 12 | housing |
| 13 | board accommodating portion |
| 14 | board accommodation chamber |
| 15 | central accommodation chamber |
| 16 | first accommodation chamber |
| 17 | second accommodation chamber |
| 18 | board insertion opening |
| 19 | upper wall portion |
| 20 | lower wall portion |
| 21 | left wall portion |
| 22 | upper fitting recess |
| 23 | lower fitting recess |
| 24 | upper lock projection |
| 25 | lower lock projection |
| 26 | first terminal holding portion (terminal holding portion) |
| 27 | first terminal accommodation chamber (terminal accommodation chamber) |
| 28 | first partition wall portion |
| 29 | first mounting hole |
| 30 | second terminal holding portion (terminal holding portion) |
| 31 | second terminal accommodation chamber (terminal accommodation chamber) |
| 32 | second partition wall portion |
| 33 | second mounting hole |
| 34 | cover |
| 35 | right side plate portion |
| 36 | upper plate portion |
| 37 | lower plate portion |
| 38 | resilient lock piece |
| 39 | retainer |
| 40 | retaining portion |
| 41 | supporting plate portion |
| 42 | circuit board |
| 43 | terminal contact surface |
| 44 | mold resin |
| 46 | first terminal fitting (terminal fitting) |
| 47 | rectangular tube portion |
| 48 | first resilient contact piece |
| 49 | crimping portion |
| 50 | wire |
| 51 | first guiding surface (guiding surface) |
| 52 | second terminal fitting (terminal fitting) |
| 53 | second resilient contact piece |
| 54 | second guiding surface (guiding surface) |

What is claimed is:

1. A connector, comprising:
   a housing including a board accommodating chamber;
   a circuit board accommodated in the board accommodating chamber;
   a pair of terminal holders formed in the housing to be integrated with the board accommodating chamber; and
   terminal fittings detachable from the terminal holders and directly connected to the circuit board while being held in the terminal holders.

2. The connector of claim 1, wherein the pair of terminal holders are disposed on sides opposite to each other across the board accommodating chamber.

3. The connector of claim 1, comprising a board insertion opening in a form of a slit open in an outer surface of the board accommodating chamber, the circuit board being insertable into the board insertion opening in a direction intersecting a plate thickness direction of the circuit board.

4. The connector of claim 3, wherein the slit is elongated in a longitudinal direction of the housing.

5. The connector of claim 1, wherein:
terminal accommodation chambers into which the terminal fittings are inserted toward the circuit board are formed in the terminal holders;
each terminal fitting is formed with a resilient contact piece configured to contact a terminal contact surface of the circuit board with each terminal fitting inserted in the terminal accommodation chambers; and
guiding surfaces disposed closer to the terminal accommodation chambers than the terminal contact surface are formed on end parts of the terminal accommodation chambers on a side of the circuit board.

6. The connector of claim 1, wherein an upper wall, a lower wall, and one of side walls of the board accommodating chamber are integrated with the pair of terminal holders.

7. A board structure, comprising:
a housing including a board accommodating chamber;
a circuit board accommodated in the board accommodating chamber;
a pair of terminal holders formed in the housing to be integrated with the board accommodating chamber and capable of holding terminal fittings; and
a board insertion opening in a form of a slit opened in an outer surface of the board accommodating chamber and elongated in a longitudinal direction of the housing, the circuit board being insertable into the board insertion opening.

* * * * *